United States Patent [19]

Katsumata et al.

[11] Patent Number: 5,729,467
[45] Date of Patent: Mar. 17, 1998

[54] METHOD OF AND SYSTEM FOR ROUTING

[75] Inventors: Akira Katsumata; Toshiyasu Sakata, both of Kawasaki, Japan

[73] Assignee: Fujitsu Limited, Kawasaki, Japan

[21] Appl. No.: 441,023

[22] Filed: May 15, 1995

[30] Foreign Application Priority Data

Jun. 16, 1994 [JP] Japan .................. 6-134500

[51] Int. Cl.$^6$ .................. G06F 17/50
[52] U.S. Cl. .................. 364/489
[58] Field of Search .................. 364/488, 489, 364/490, 491

[56] References Cited

U.S. PATENT DOCUMENTS

| | | | |
|---|---|---|---|
| 4,500,963 | 2/1985 | Smith et al. | 364/300 |
| 4,615,011 | 9/1986 | Linsker | 364/491 |
| 4,713,773 | 12/1987 | Cooper et al. | 364/491 |
| 4,858,143 | 8/1989 | Fournier | 364/491 |
| 5,375,069 | 12/1994 | Satoh et al. | 364/490 |
| 5,394,337 | 2/1995 | Shinjo | 364/490 |
| 5,483,461 | 1/1996 | Lee et al. | 364/490 |
| 5,519,632 | 5/1996 | Chen et al. | 364/490 |

*Primary Examiner*—Gary Chin
*Assistant Examiner*—Leigh Marie Garbowski
*Attorney, Agent, or Firm*—Staas & Halsey

[57] ABSTRACT

A routing preprocessing unit properly rearranges routing conditions beforehand with respect to parts in which physical conditions in terms of assembling or packaging in an original circuit are changeable. A feedback section feeds pin assignment data back to an assembling or a packaging design system for high-order hierarchy parts in the original circuit and thus changes a pin assignment through a design of the high-order hierarchy parts themselves. An automatic routing unit specifically designs high-density wiring patterns without using a via. A routing layer allocating section collects part-to-part route bundles bearing such a positional relationship as to cause no intersection and no overlap on the basis of routing data and allocates the route bundle to the same routing layer on a multilayer routing board including a plurality of routing layers. A routing order determining section determines a routing order of the route bundle. A detail routing section creates PCB wiring patterns by sequentially arranging respective connection lines.

26 Claims, 15 Drawing Sheets

METHOD OF AND SYSTEM FOR ROUTING

BACKGROUND OF THE INVENTION

1. Field of the Invention

The present invention relates generally to a routing system for automatically performing routing, i.e., designing wiring patterns on a circuit board such as a so-called printed circuit board (PCB) (hereinafter abbreviated to "PBC") having a single routing layer or multiple routing layers. The present invention relates more particularly to a routing method and a routing system that are suited to a case where the use of a via, i.e., an inter-layer connection path, is restricted in the circuit board including the multiple routing layers.

2. Description of the Related Art

On routing, viz., designing wiring patterns on the PCB, a plurality of routing layers are often combined by one or more vias which are formed by, e.g., through-hole processing or the like, so as to provide a high density wiring. The vias connect the respective wiring patterns on the routing layers between the layers for combining them. Thus, the conventional wiring pattern designing entails the use of the vias for connecting the routing layers to each other. Accordingly, also in the routing system conceived as a kind of CAD (Computer Aided Design) system for automatically designing the PCB wiring patterns, generally, the patterns on the respective routing layers are connected by the vias, and the plurality of routing layers are combined, thereby attaining the high density wiring.

The via is often employed for the routing on a multilayered PCB. The use of the via is, however, restricted for a variety of reasons in some cases. The reasons for restricting the use of the via may be given by an electrical problem, a problem in terms of costs, a structural problem and a problem in terms of a board material, for example.

If the via can not absolutely be used, all the routes have to be arranged within the same routing layer. In such a case, a positional relationship of the respective wiring patterns exerts a large influence on a routing density. It is because the routes in an intersecting relationship are hard to intermix within the same routing layer. A general PCB is based on the premise of using the via, and, therefore, when designing the wiring pattern, the route intersecting relationship is not substantially taken into consideration. Hence, it is quite difficult for the conventional routing system to automatically performing the high-density routing without the via.

SUMMARY OF THE INVENTION

It is a primary object of the present invention to provide a method of and system for routing capable of affecting rational routing and creating wiring patterns by using a via as less as possible even on a multilayer board.

A first aspect of a routing system according to the present invention comprises a connection allocating section for setting an allocation of connection lines of an original circuit to equalize directional vectors of the connection lines in the units of a part as much as possible with respect to parts where a signal assignation can be arbitrarily set; a part arranging section for setting an arrangement of the parts to minimize intersections of synthetic vectors of the connection lines per part on the basis of routing data undergoing allocation processing of the line connections by the connection allocating section; a pin assigning section for changing an inter-part pin assignment so as not to cause an intersection of the part-to-part connection lines on the basis of the routing data undergoing the part arrangement processing by the part arranging section with respect to the parts where the inter-part pin assignment is changeable; a layer allocating section for collecting route bundles bearing such a positional relationship as to cause no intersection and no overlap on the basis of the routing data undergoing the pin assignation processing by the pin assigning section and allocating the route bundle to the same routing layer on a multilayer circuit board including a plurality of routing layers; an order section for setting a routing order per routing layer on the basis of the routing data undergoing the routing layer allocation processing by the layer allocating section; and a pattern creating section for creating wiring patterns on the circuit board by setting routing positions within each routing layer in accordance with the routing order set by the order setting section.

In the routing system according to the first aspect given above, the pin assigning section may include a feedback section for feeding an item of data for changing the pin assignment back to a design system of high-order hierarchy parts.

In the routing system according to the first aspect given above, the layer allocating section may include a virtual routing section for arranging a virtual route bundle at a minimum distance between the parts; a grouping section for grouping the virtual route bundles arranged by the virtual routing section according to every route bundle with no intersection and no overlap without a large detour; and a group allocating section for allocating the respective groups obtained by the grouping section to the routing layers different from each other. Further, the order setting section may include a route bundle order setting section for setting a routing order of the route bundle preferentially from the route bundle positioned at the edge with respect to the virtual route bundles arranged by the virtual routing section; a diverting direction setting section for setting a diverting direction of the route bundle in accordance with the routing order set by the route bundle order setting section; and a routing order setting section for setting the routing order within each route bundle in accordance with the diverting direction preferentially from a route at a far distance with respect to the routes within the route bundle.

In the routing system according to the first aspect given above, the pattern creating section may include a route setting section for setting a route by assuming a parallelogram serving as a minimum part-to-part routing distance and extending a search line in a direction along this parallelogram.

A second aspect of a routing system according to the present invention comprises a connection allocating section for setting an allocation of connection lines of an original circuit to equalize directional vectors of the connection lines in the units of a part as much as possible with respect to parts where a signal assignation can be arbitrarily set; a part arranging means for setting an arrangement of the parts to minimize intersections of synthetic vectors of the connection lines per part on the basis of routing data undergoing allocation processing of the line connections by the connection allocating section; a pin assigning section for changing an inter-part pin assignment so as not to cause an intersection of the part-to-part connection lines on the basis of the routing data undergoing the part arrangement processing by the part arranging section with respect to the parts where the inter-part pin assignment is changeable; an order setting section for setting a routing order on the basis of the routing data undergoing the pin assignation processing by the pin assigning section; and a pattern creating section for creating wiring patterns on the circuit board by setting routing positions in accordance with the routing order set by the order setting section.

In the routing system according to the second aspect, the pin assigning section includes a feedback section for feeding an item of data for changing the pin assignment back to a design system of high-order hierarchy parts.

In the routing system according to the second aspect, the order setting section may include a virtual routing section for arranging a virtual route bundle at a minimum distance between the parts; a route bundle order setting section for setting a routing order of the route bundle preferentially from the route bundle positioned at the edge with respect to the virtual route bundles arranged by the virtual routing section; a diverting direction setting section for setting a diverting direction of the route bundle in accordance with the routing order set by the route bundle order setting section; and a routing order setting section for setting the routing order within each route bundle in accordance with the diverting direction preferentially from a route at a far distance with respect to the routes within the route bundle.

In the routing system according to the second aspect, the pattern creating section may include a route setting section for setting a route by assuming a parallelogram serving as a minimum part-to-part routing distance and extending a search line in a direction along this parallelogram.

A third aspect of a routing system according to the present invention comprises a layer allocating section for collecting the route bundles bearing such a positional relationship as to cause no intersection and no overlap on the basis of the routing data and allocating the route bundle to the same routing layer on a multilayer circuit board including a plurality of routing layers; an order setting section for setting a routing order per routing layer on the basis of the routing data undergoing the routing layer allocation processing by the layer allocating section; and a pattern creating section for creating wiring patterns on the circuit board by setting routing positions within each routing layer in accordance with the routing order set by the order setting section.

In the routing system according to the third aspect, the layer allocating section may include a virtual routing section for arranging a virtual route bundle at a minimum distance between the parts; a grouping section for grouping the virtual route bundles arranged by the virtual routing section according to every route bundle with no intersection and no overlap without a large detour; and a group allocating section for allocating the respective groups obtained by the grouping section to the routing layers different from each other. Further, the order setting section may include a route bundle order setting section for setting a routing order of the route bundle preferentially from the route bundle positioned at the edge with respect to the virtual route bundles arranged by the virtual routing section; a diverting direction setting section for setting a diverting direction of the route bundle in accordance with the routing order set by the route bundle order setting section; and a routing order setting section for setting the routing order within each route bundle in accordance with the diverting direction preferentially from a route at a far distance with respect to the routes within the route bundle.

In the routing system according to the third aspect, the pattern creating section may include a route setting section for setting a route by assuming a parallelogram serving as a minimum part-to-part routing distance and extending a search line in a direction along this parallelogram.

In the routing system according to the first aspect of the present invention, an allocation of connection lines of an original circuit is set to equalize directional vectors of the connection lines in the units of a part as much as possible with respect to parts where a signal assignation can be arbitrarily set. An arrangement of the parts is set to minimize intersections of synthetic vectors of the connection lines per part. An inter-part pin assignment is changed so as not to cause an intersection of the part-to-part connection lines with respect to the parts where the inter-part pin assignment is changeable. The route bundles bearing such a positional relationship as to cause no intersection and no overlap are collected and allocated to the same routing layer on a multilayer circuit board including a plurality of routing layers. A routing order per routing layer is set, and wiring patterns on the circuit board are created by setting routing positions within each routing layer in accordance with the routing order. The rational high-density wiring patterns using few vias to the greatest possible degree can be thereby created on the multilayer board.

In the routing system according to the second aspect of the present invention, an allocation of connection lines of an original circuit is set to equalize directional vectors of the connection lines in the units of a part as much as possible with respect to parts where a signal assignation can be arbitrarily set. An arrangement of the parts is set to minimize intersections of synthetic vectors of the connection lines per part. An inter-part pin assignment is changed so as not to cause an intersection of the part-to-part connection lines with respect to the parts where the inter-part pin assignment is changeable. A routing order is set, and routing positions are set in accordance with the routing order. It is thus possible to design the rational high-density wiring patterns on a single layer board also.

In the routing system according to the third aspect of the present invention, the route bundles bearing such a positional relationship as to cause no intersection and no overlap are collected on the basis of the routing data. The route bundle is allocated to the same routing layer on a multilayer circuit board including a plurality of routing layers. A routing order per routing layer is set, and wiring patterns on the circuit board are created by setting routing positions within each routing layer in accordance with the routing order. It is thus feasible to create the wiring patterns using the via as much as possible on the multilayer board.

According to the routing system of the present invention, it is possible to create the rational wiring patterns capable of reducing the costs, increasing a yield and decreasing noises, since the route bundles bearing such a positional relationship as to cause no intersection and no overlap are collected based on the routing data and allocated to the same routing layers, the routing order per routing layer is set, and the wiring patterns on the circuit board are created by setting the routing positions within each routing layer in accordance with the routing order.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

There will now be described embodiments of the present invention with reference to the accompanying drawings.

<Embodiment 1>

A routing system according to a first embodiment of the present invention will be explained with reference to FIGS. 1, 2, 3 and 4.

This routing system is basically constructed of a computer system equipped with an I/O device including a display and a keyboard, a memory device including a disk device and a memory, and a central processing unit (CPU). The routing system is embodied mainly based on software, where each constructive element is a function module of a program. As a matter of course, the routing system can be actualized in the form of a combination of sets of hardware for individually materializing the function of each constructive element.

The routing system illustrated in

Figure 1:
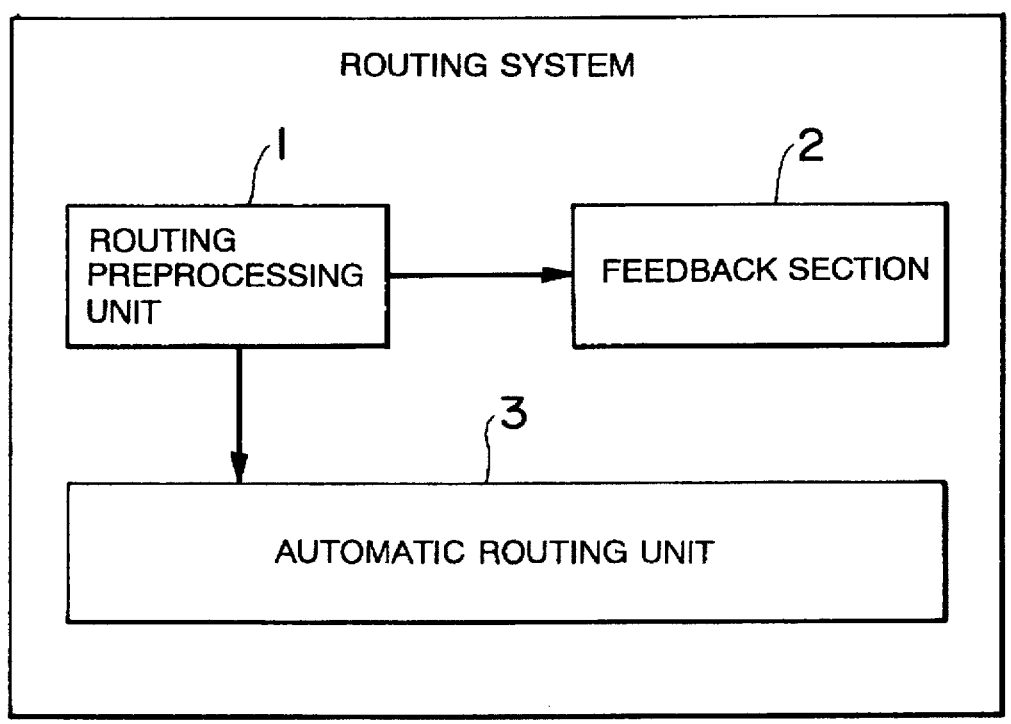
FIG. 1 is a block diagram showing the construction of a first embodiment of a routing system according to the present invention.

FIG. 1 comprises a routing preprocessing unit 1, a feedback section 2 and an automatic routing unit 3.

The routing preprocessing unit 1 has, as illustrated in

Figure 2:
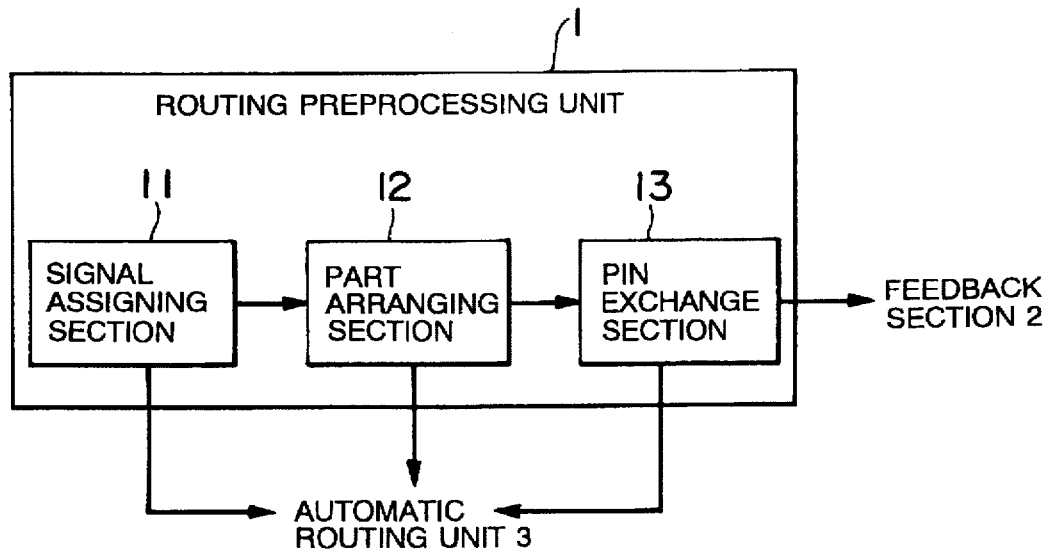
FIG. 2 is a block diagram illustrating a detailed configuration of a routing preprocessing unit of the routing system of FIG. 1.
Figure 3:
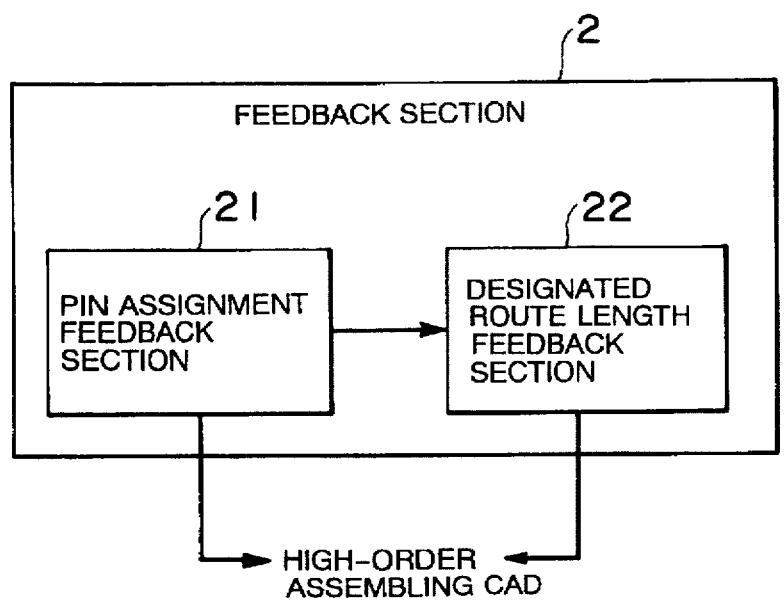
FIG. 3 is a block diagram illustrating a detailed configuration of a feedback section of the routing system of FIG. 1.

FIG. 2, a signal assigning section 11, a part arrangement section 12 and a pin exchange section 13. The routing preprocessing unit 1 properly sorts out routing conditions beforehand with respect to portions wherein physical conditions in terms of assembling or packaging in an original circuit are changeable.

The signal assigning section 11 sets an allocation of connection lines of the original circuit so that directional vectors of the connection lines such as signal wires in the units of a part are equalized to the greatest possible degree with respect to the parts wherein an assignation of the signals can be arbitrarily set. Herein, the term "part" indicates a part of a high-order hierarchy with respect to a PCB to be routed, and which includes, e.g., a subboard or the like as well as general parts such as an IC (Integrated Circuit), a connector and the like. That is, the signal assigning section 11, because of an occurrence of intersections of the connection lines if connection lines extending in a different direction from, e.g., a certain part are connected, changes the signal assignation to terminals so that the vectors of the connection lines in the units of a part act in the same direction as much as possible in the original circuit with respect to such parts that the signal assignation to a connector or the subboard can be arbitrarily set.

The part arrangement section 12 sets an arrangement of the parts to minimize synthetic vectors of the connection lines for individual routes after assigning the signals, i.e., to minimize intersections of synthetic values when the respective signal wires are vectorized. That is, the part arrangement section 12 changes the arrangement with respect to the original circuit to minimize the intersections of the part-to-part connection lines.

The pin exchange section 13 changes an inter-part pin assignment so that the part-to-part connection lines do not intersect each other after setting the part arrangement with respect to the parts wherein the inter-part pin assignment is changeable, and supplies an item of pin exchange data to the feedback section 2. More specifically, the pin exchange section 13 replaces the inter-part pin assignment so as to cause no intersection of the part-to-part connection lines with respect to the parts wherein the inter-part pin assignment is changeable as in the case of a connector with a non-standardized pin assignment and a device like an IC that will be manufactured based on desired specifications or a subboard after setting the part arrangement.

The feedback section 2 includes a pin assignment feedback section 21 and a designated route length feedback section 22. If the present system is linked to an assembling or a packaging design system (hereinafter termed a "assembling CAD") of the parts of the high-order hierarchy in the original circuit, the feedback section 2 changes the pin assignment on the basis of a design of the high-order hierarchy parts themselves by feeding the pin assignment data back to the assembling CAD. This feedback section 2 and the pin exchange section 13 of the routing preprocessing unit 1 are combined to constitute a pin assignment section.

The pin assignment feedback section 21 feeds an item of pin assignment exchange data for causing no intersection of the connection lines in the pin exchange section 13 back to the assembling CAD of the high-order hierarchy part in order to reflect it in the high-order hierarchy part itself. The designated route length feedback section 22 feeds a transition quantity of a designated route length with a pin assignment change based on the exchange of the pin assignment back to the assembling CAD of the high-order hierarchy part to reflect it in the high-order hierarchy part itself.

Figure 4:
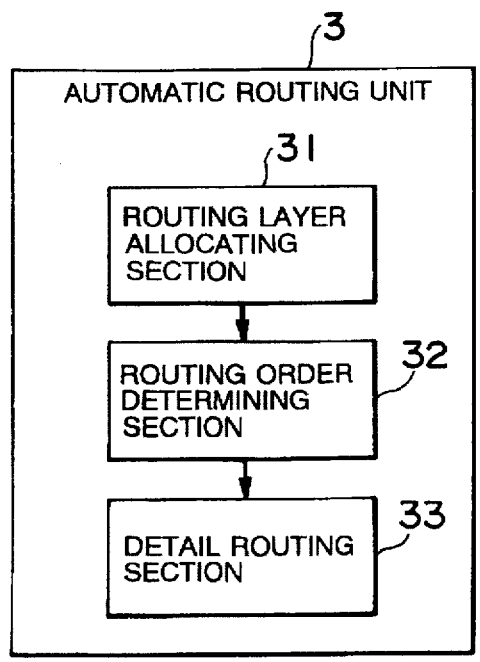
FIG. 4 is a block diagram illustrating a detailed configuration of an automatic routing unit of the routing system of FIG. 1.

The automatic routing unit 3 includes, as illustrated in FIG. 4, a routing layer allocating section 31, a routing order determining section 32 and a detail routing section 33. The automatic routing unit 3 specifically designs high-density wiring patterns without using a via as much as possible on the basis of an item of original circuit data preprocessed in the routing preprocessing unit 1.

The routing layer allocating section 31 collects part-to-part route bundles bearing such a positional relationship as to cause no intersection and no overlap on the basis of pieces of routing data preprocessed in the routing preprocessing unit 1 but undergoing the pin assignment. The routing layer allocating section 31 then allocates the bundle of routes to the same routing layer on a multilayer routing board having a plurality of routing layers. Namely, the route bundle allocated to the same routing layer by this routing layer allocating section 31 has no intersection and no overlap and is therefore invariably to be routed within the same routing layer. The routing layer allocating section 31, specifically, sets virtual route bundles to be routed at the minimum distance for every part coupling in the units of a part and groups such route bundles for every route bundle with no intersection and no overlap. The routing layer allocating section 31 further allocates each of the thus grouped route bundles to each of the routing layers.

The routing order determining section 32 determines a routing order of the individual routes on the basis of the above virtual route bundles with respect to the route bundles allocated to the same routing layer by the routing layer allocating section 31. That is, the routing order determining section 32, specifically, determines the routing order in the units of a part, i.e., in the units of a route bundle sequentially from the edge of the physical placement with respect to the virtual route bundles. Then, the routing order determining section 32 sequentially determines diverting directions of these virtual route bundles. The routing order determining section 32 further sequentially determines routing orders of the individual routes from the far distance route (having a large route length) within the virtual route bundles.

The detail routing section 33 sequentially arranges the connection lines (signal lines) in accordance with the routing orders determined by the routing order determining section 32, thus forming PCB wiring patterns.

Next, the operation of the thus configured routing system shown in FIGS. 1–4 will be explained.

Figure 5:
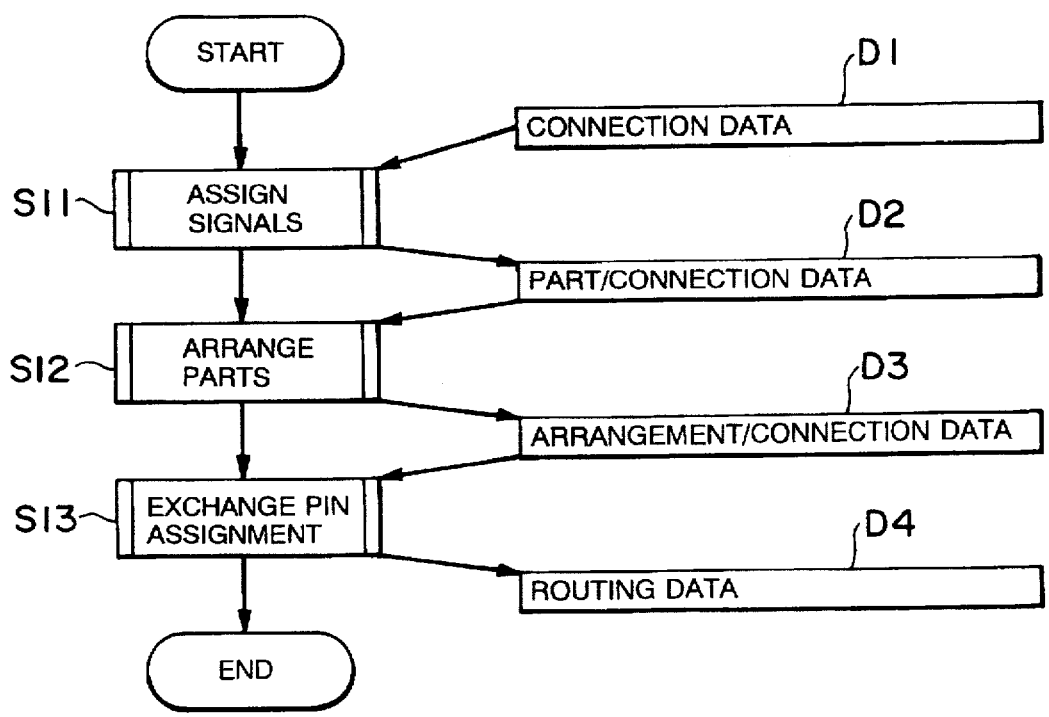
FIG. 5 is a flowchart for illustrating the process of the routing preprocessing unit of the routing system of FIG. 1.

When starting the processing in the routing system, to start with, the routing preprocessing performs routing preprocessing. The routing preprocessing by the routing preprocessing unit 1 will be explained with reference to a flowchart shown in FIG. 5.

Figure 6:
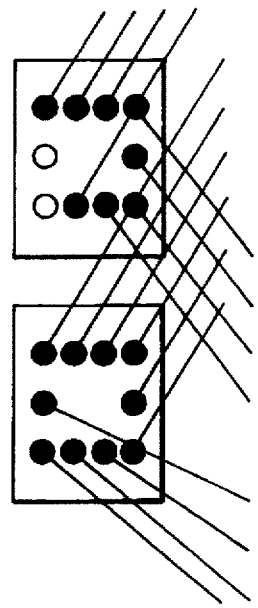
FIG. 6 is a schematic diagram for illustrating the intersections of connection lines in regards to the operation of the routing system of FIG. 1.
Figure 7:
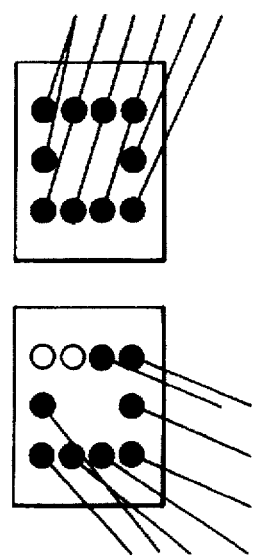
FIG. 7 is a schematic diagram for illustrating a signal assignation pertaining to the operation of the routing system of FIG. 1.

When starting the routing preprocessing, first, the signal assigning section 11 changes and sets an allocation of the connection lines of the original circuit so that the directional vectors of the connection lines such as the signal wires in the units of a part are equalized as much as possible with respect to the high-order hierarchy parts wherein the signal assignation can be arbitrarily set on the basis of an item of connection data D1 of the original circuit, thereby obtaining an item of part/connection data D2 (step S11). For example, as illustrated in FIG. 6, the connection lines intersect when connecting the connection lines extending in a different direction from a certain part. The occurrence of such intersections makes it difficult to effect the routing on the same routing layer. Therefore, in step S12, the signal assignation to the terminals is changed so that the vectors of the connections wires in the units-of a part are, as illustrated in FIG. 7, set in the same direction as much as possible on the basis of the above connection data with respect to the parts wherein the signal assignation to the connector or the subboard can be arbitrarily set, thereby generating the part/connection data D2.

Figure 8:
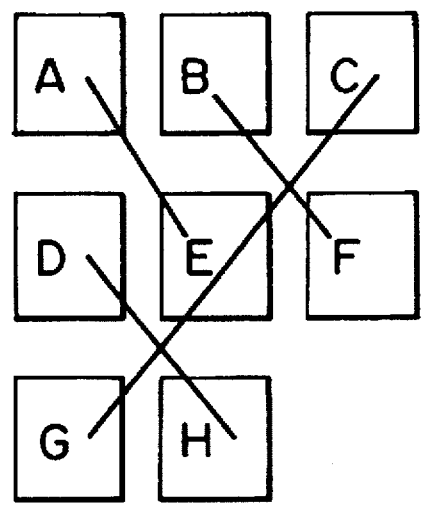
FIG. 8 is a schematic diagram for illustrating the intersections of the connection lines in regards to the operation of the routing system of FIG. 1.
Figure 9:
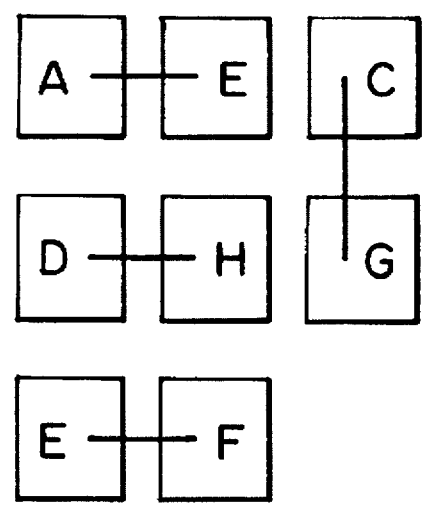
FIG. 9 is a schematic diagram for illustrating an arrangement of parts in regards to the operation of the routing system of FIG. 1.

Next, the part arrangement section 12 sets an arrangement of the parts to minimize the intersections of the synthetic vectors of the connection lines for individual routes on the basis of the part/connection data D2, thereby obtaining an item of arrangement/connection data D3 (step S12). For instance, as illustrated in FIG. 8, if the connection lines between the parts A through H intersect each other, in step S12, there is generated the arrangement/connection data D3 to minimize the intersections of the connection lines between the parts A through H after changing the part arrangement as illustrated in FIG. 9.

Figure 10:
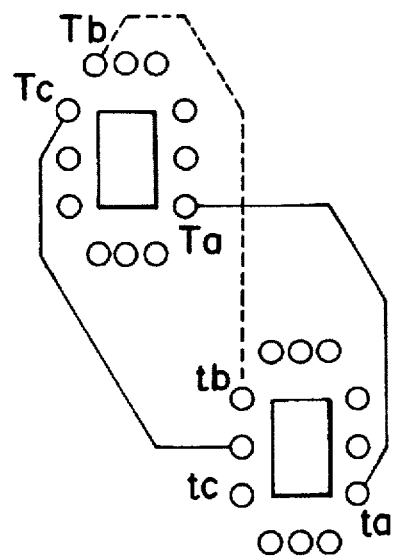
FIG. 10 is a schematic diagram for illustrating the intersections of the connection lines in regards to the operation of the routing system of FIG. 1.
Figure 11:
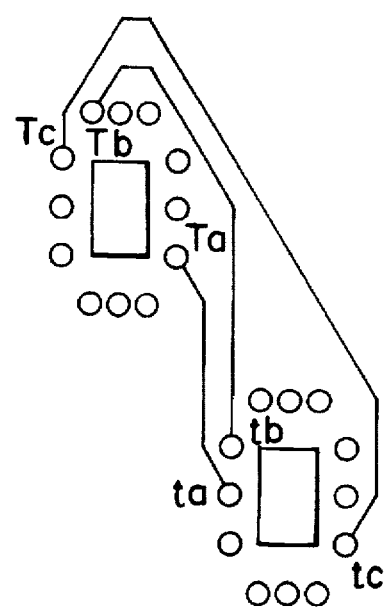
FIG. 11 is a schematic diagram for illustrating an exchange of a pin assignment in regards to the operation of the routing system of FIG. 1.
Figure 22:
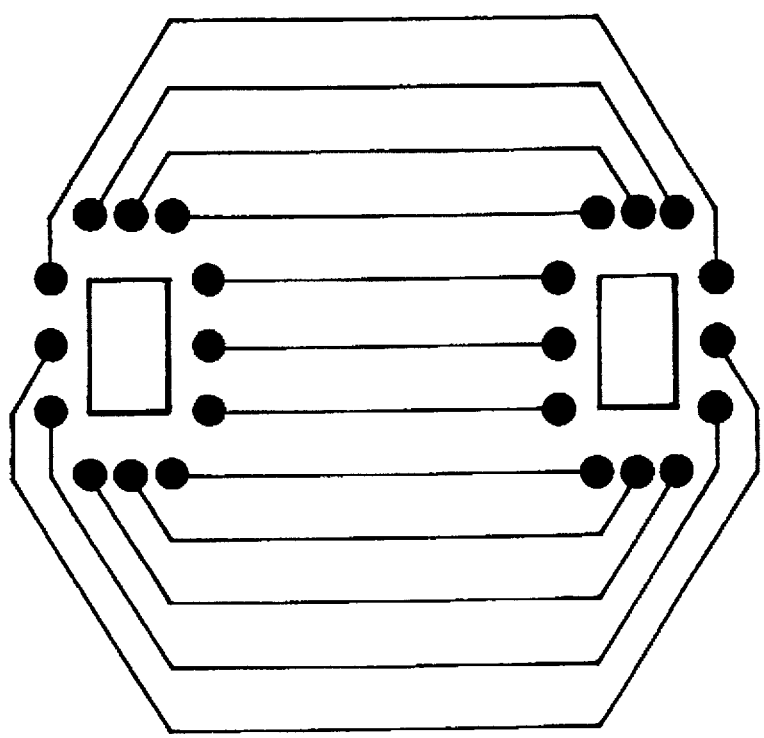
FIG. 22 is a schematic diagram for illustrating an example of an ideal pin assignment in the routing preprocessing unit of the routing system of FIG. 1.

Then, the pin exchange section 13 changes the inter-part pin assignment so that the part-to-part connection lines do not intersect each other after setting the part arrangement with respect to the parts wherein the inter-part pin assignment is changeable on the basis of the arrangement/connection data D3, thereby obtaining an item of routing data D4 (step S13). With respect to the parts such as the connector, the device or the subboard wherein the inter-part pin assignment is changeable, for example, as illustrated in FIG. 10, if the part-to-part connection lines intersect (a connection line extending between terminals Ta and ta of the parts intersects a connection line extending between terminals Tb and tb thereof in FIG. 10), in step S13, the inter-part pin assignment is exchange, thereby generating such an item of routing data D4 as to cause no intersection of the part-to-part connection lines (the allocation is changed from the terminals tc, tb and ta of the part disposed right downward to the terminals ta, tb and tc in FIG. 11) as shown in FIG. 11. FIG. 22 illustrates an example of the ideal pin assignment and routing in this case.

In this way, the routing preprocessing unit 1 properly sorts out the routing conditions beforehand with respect to the parts wherein the physical conditions in terms of the assembling or packaging in the connection data D1 of the original circuit and thus obtains the routing data D4.

Figure 12:
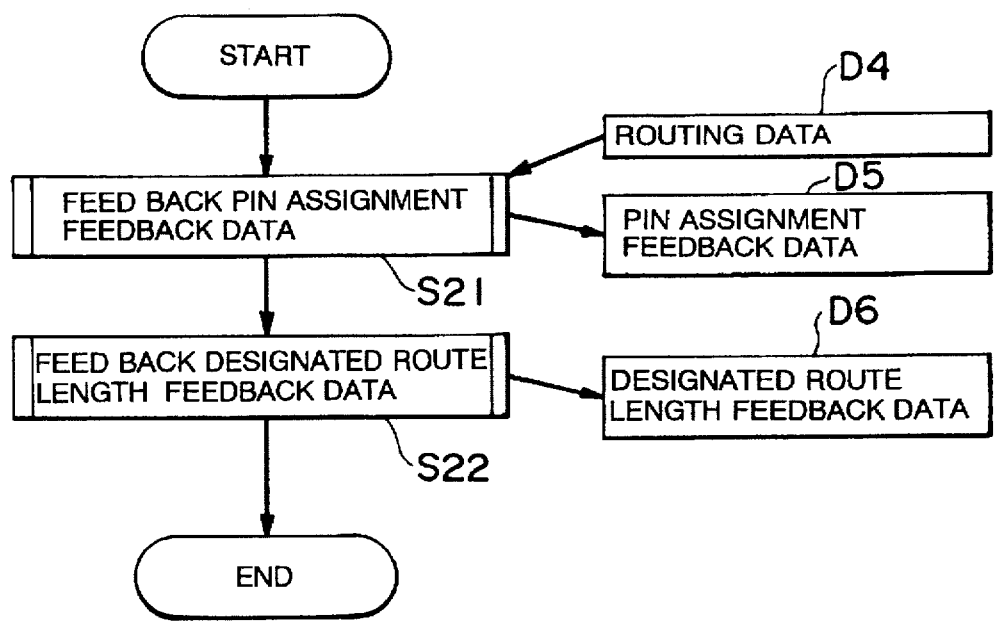
FIG. 12 is a flowchart for illustrating the process of the feedback section of the routing system of FIG. 1.

Next, the feedback section 2 performs the feedback to the high-order hierarchy part. This feedback processing is related to the routing preprocessing by the routing preprocessing unit 1 and may be effected in parallel to the routing preprocessing. The feedback processing by the feedback section 2 will be explained with reference to a flowchart shown in FIG. 12.

When starting the feedback processing, at the first onset, the pin assignment feedback section 21 generates an item of pin assignment feedback data D5 for reflecting an item of pin assignment exchange data for causing no intersection of the connection lines in the high-order hierarchy part itself on the basis of the routing data D4. The pin assignment feedback section 21 then feeds the pin assignment feedback data D5 back to the assembling CAD of the high-order hierarchy part (step S21). Next, the designated route length feedback section 22 generates an item of designated route length feedback data D6 for reflecting the transition quantity of the designated route length with the pin assignment change based on the pin assignment exchange in the high-order hierarchy part. The designated route length feedback section 22 then feeds the designated route length feedback data D6 back to the assembling CAD of the high-order hierarchy part (step S22).

Thus, if the present system is linked to the assembling CAD of the high-order hierarchy part in the original circuit, the feedback section 2 feeds the pin assignment data back to the assembling CAD and changes the pin assignment by a design of the high-order hierarchy part itself.

Figure 13:
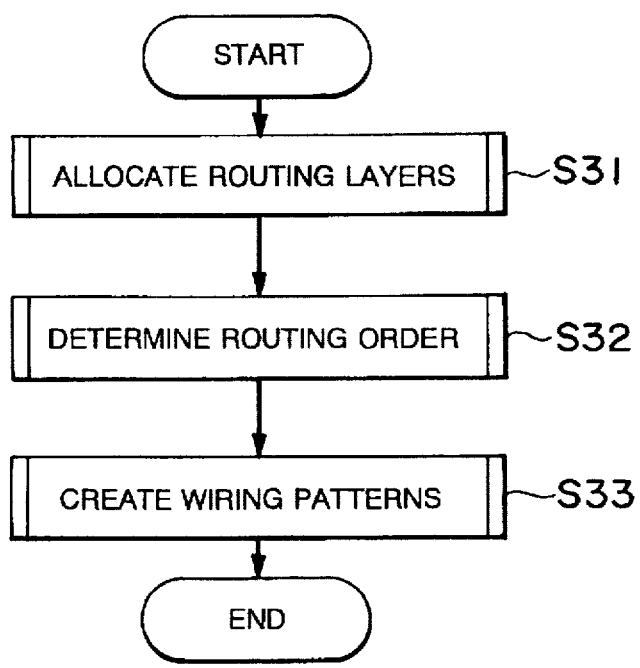
FIG. 13 is a flowchart for illustrating the process of the automatic routing unit of the routing system of FIG. 1.

Next, the automatic routing unit 3 performs wiring pattern generation processing. The wiring pattern creation processing by the automatic routing unit 3 will be described with reference to a flowchart shown in FIG. 13.

When starting the wiring pattern creation processing, first, the routing layer allocating section 31 collects the part-to-part route bundles bearing such a positional relationship as to cause no intersection and no overlap on the basis of the routing data D4 and allocates the bundle of routes to the same routing layer on the multilayer routing board (step S31). The route bundles allocated to the same routing layer in step S31 have no intersection and no overlap and are therefore invariably to be routed within the same routing layer.

Figure 14:
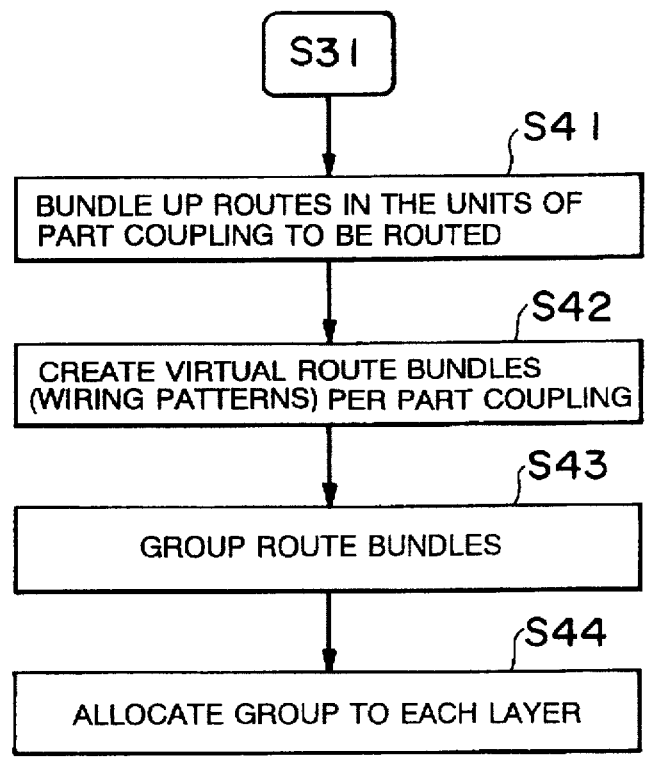
FIG. 14 is a flowchart for illustrating the detailed process of a routing layer allocating section of the automatic routing unit of FIG. 4.
Figure 15:
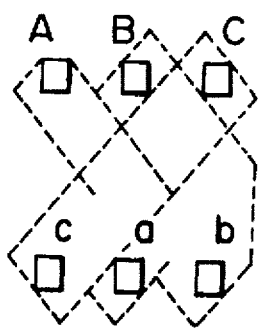
FIG. 15 is a schematic diagram for illustrating an example of virtual routing related to the operation of the automatic routing unit of FIG. 4.

Step S31 is constructed of a combination of the processes as shown in FIG. 14. The routing layer allocating section 31, at first, bundles up the routes for every part coupling in the units of a part which bears a routing relationship (step S41). The route bundle in step S41 virtually forms a bundle of routes to be routed between the relevant parts at the minimum distance, thereby obtaining a virtual bundle of routes as shown in, e.g., FIG. 15 (step S42). At this time, the overlaps and the intersections of the virtual route bundles are ignored, and each route bundle has a route width corresponding to the number of routes constituting each route bundle.

Figure 16:
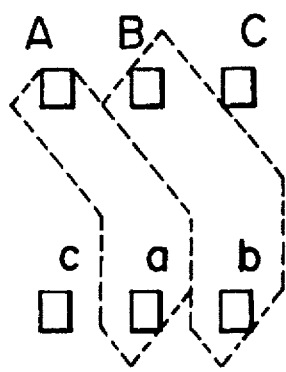
FIG. 16 is a schematic diagram for illustrating an example of grouping route bundles in regards to the operation of the automatic routing unit of FIG. 4.

Then, the virtual route bundles formed in step S42 are grouped per route bundle having no intersection and no overlap (step S43). This grouping is, as illustrated in, e.g., FIG. 16, is conducted so that the route bundles bearing a non-intersecting relationship without a large detour and the route bundles bearing a non-overlapping relationship are arranged in the same group. In this case, there exist a plurality of combinatorial variations in the way of combining the route bundles, and, therefore, the grouping is repeated in a trial-and-error manner, thus forming an optimal group of route bundles. For instance, so far as there is no intersection and no overlap, it is desirable that the grouping be performed to uniform the number of routes and the number of route bundles constituting each group with a less number of groups. Especially, a combination of the route bundles extending along each other (adjacently) are preferentially allocated to the same group. The group of virtual route bundles grouped in step S43 are allocated to each routing layer (step S44).

Next, the routing order determining section 32 determines the routing order of the individual routes with respect to the route bundle allocated to the same routing layer in step S31 (step S32).

Figure 17:
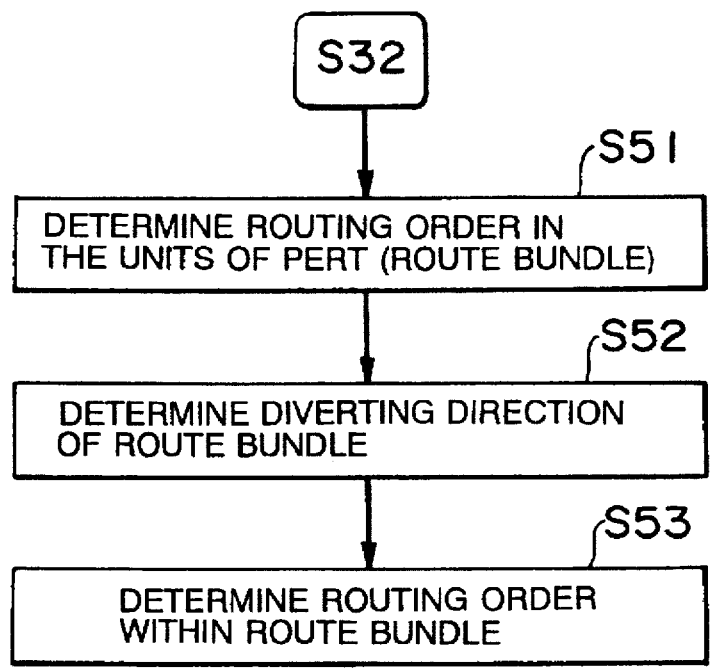
FIG. 17 is a flowchart for illustrating the detailed process of a routing order determining section of the automatic routing unit of FIG. 4.

Step S32 is, more specifically, constructed of a combination of the processes as shown in FIG. 17. The routing order determining section 32, at first, determines the routing order of the virtual route bundles in sequence from the edge of the physical placement in the units of a part, i.e., in the units of a route bundle (step S51). In this step S51, the routing order of the route bundles is determined in sequence from the route bundle positioned at the edge among the route bundles. For example, when assuming that the first order is given to the route bundle positioned at the right edge, the routing order is determined in sequence in such a manner that the next order is given to the route bundle disposed second from the right edge, and the subsequent order is given to the route bundle disposed third from the right edge. On the other hand, for instance, when assuming that the first order is given to the route bundle positioned at the left edge, the routing order is sequentially determined in such a way that the next order is given to the route bundle disposed second from the left edge, and the subsequent order is given to the route bundle disposed third from the left edge. Some latitude is allowed in the order selection in this case, and hence the routing order is set in the trial-and-error manner, thus selecting the optimal order.

Figure 18:
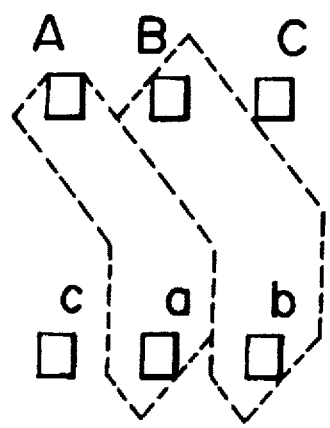
FIG. 18 is a schematic diagram for illustrating an example of route diverting in regards to the operation of the automatic routing unit of FIG. 4.
Figure 19:
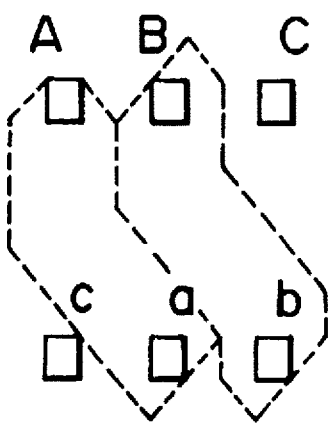
FIG. 19 is a schematic diagram for illustrating another example of the route diverting in regards to the operation of the automatic routing unit of FIG. 4.
Figure 20:
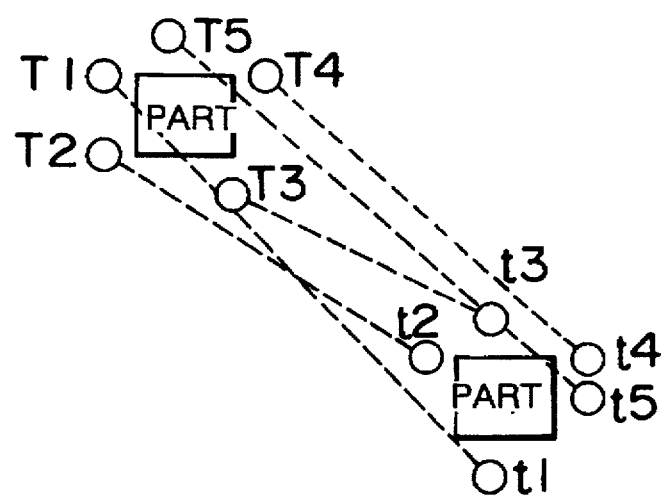
FIG. 20 is a schematic diagram for illustrating an example of a routing order in regards to the operation of the automatic routing unit of FIG. 4.

Next, the diverting direction is sequentially determined with respect to the order-determined route bundles in step S51 (step S52). This diverting direction is determined in accordance with the routing order set in, e.g., step S51. As illustrated in FIG. 18, if the routing order is set such as (1) B-b and (2) A-a from the right edge, the diverting direction is diverted rightward. As illustrated in FIG. 19, if the routing order is set such as (1) A-a and (2) B-b from the left edge, the diverting direction is diverted leftward. Further, the routing order is determined in sequence from the far distance route with respect to the individual routes within the respective route bundles where the diverting direction is determined in step S52 (step S53). In this case, the routing order is determined corresponding to the route diverting direction set in step S52. For example, if diverted rightward, the diverting order is set such as T1-t1 to T5-t5 as shown in FIG. 20. If diverted leftward, the diverting order is set such as T5-t5 to T1-t1 as shown in FIG. 20.

Figure 21:
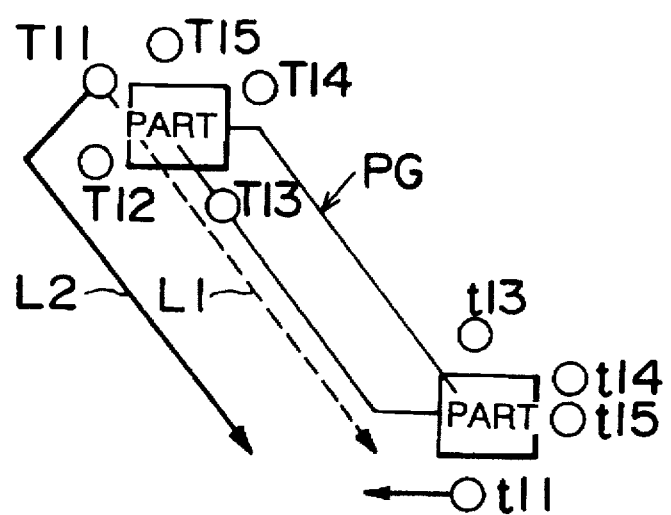
FIG. 21 is a schematic diagram for illustrating an example of creating wiring patterns in regards to the operation of the automatic routing unit of FIG. 4.

Further, the detail routing section 33 sequentially arranges the connection lines in accordance with the routing order determined in step S32, thus creating a PCB wiring pattern (step S33). When creating this wiring pattern, as depicted in FIG. 21, a parallelogram PG conceived as a minimum part-to-part routing distance is virtually determined, and the wiring pattern is created in sequence from the first route in terms of the routing order determined in step S32. A route of T11-t11 of FIG. 21 has the first routing order, and, if diverted in the left direction, as indicated by an arrowed broken line L1, a search line of the wiring pattern is extended in the direction along the parallelogram PG, thus searching the wiring pattern. In the case of the illustration, as a matter of fact, the route shown by the arrowed broken line L1 hinders a route of T12-t12, and, therefore, a route indicated by an arrowed solid line L2 is adopted for a wiring pattern.

Figure 23:
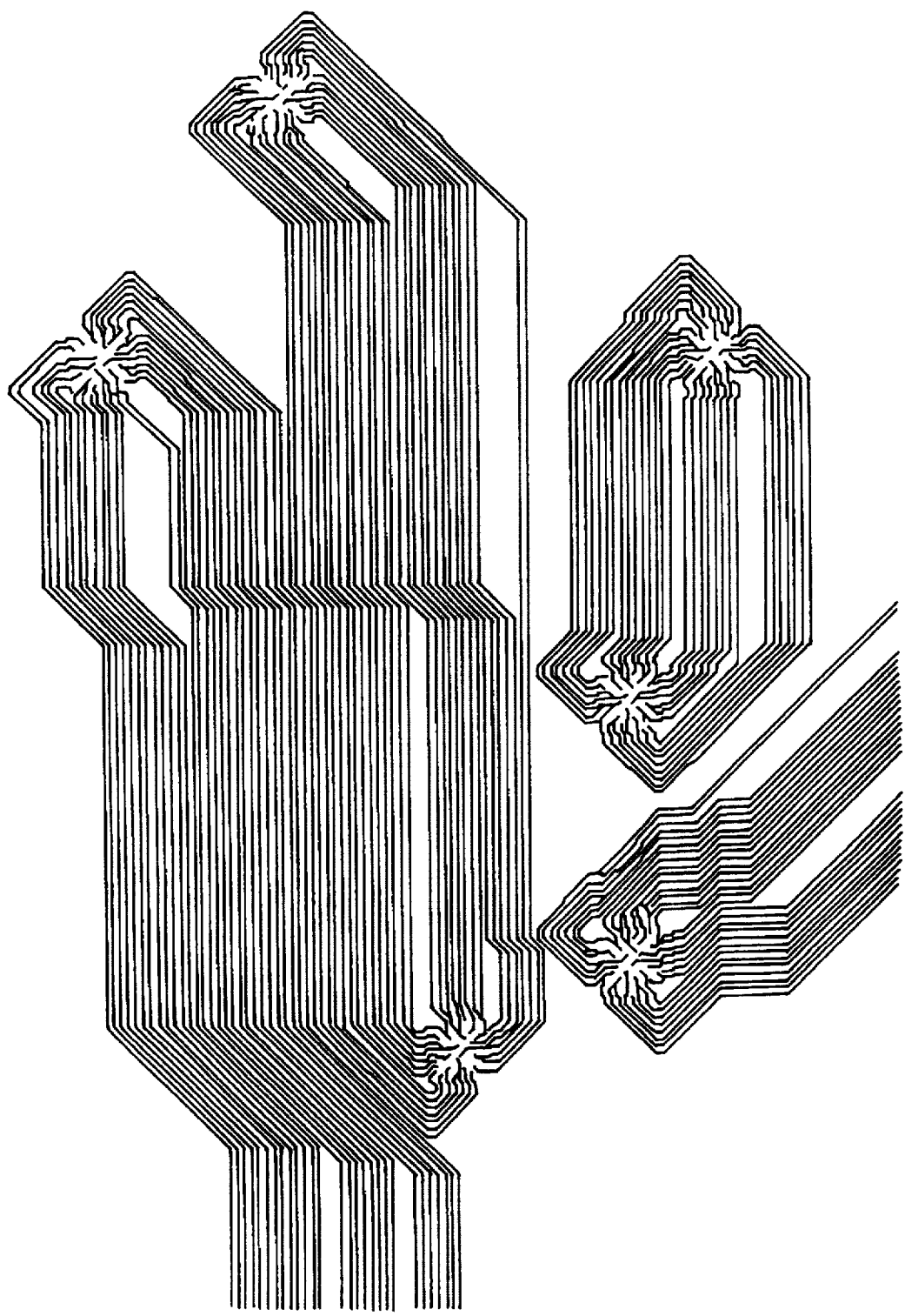
FIG. 23 is a schematic diagram for partially illustrating an example of a result of creating the wiring patterns on a single layer by the routing system of FIG. 1.

Thus, the automatic routing unit 3 creates a high density wiring pattern without using the via on the basis of the original circuit data preprocessed by the routing preprocessing unit 1. FIG. 23 shows one specific example of the wiring pattern within the thus created single routing layer. Referring to FIG. 23, it can be known that the wiring patterns are formed neatly with a high density.

Note that this routing system is capable of automatically effectively creating the wiring patterns even on a single layer PCB including not a multilayer PCB but only the single routing layer. In the case of the single layer PCB, there is eliminated the necessity for the whole routing layer allocating section 31 of the automatic routing unit 3. Accordingly, when dedicated to the single layer PCB, the routing system may be configured by eliminating the routing layer allocating section 31 of the automatic routing unit 3.

<Embodiment 2>

A routing system according to a second embodiment of the present invention will be discussed with reference to FIGS. 24 and 25. This routing system is a system that is not linked to the high-order hierarchy assembling CAD.

Figure 24:
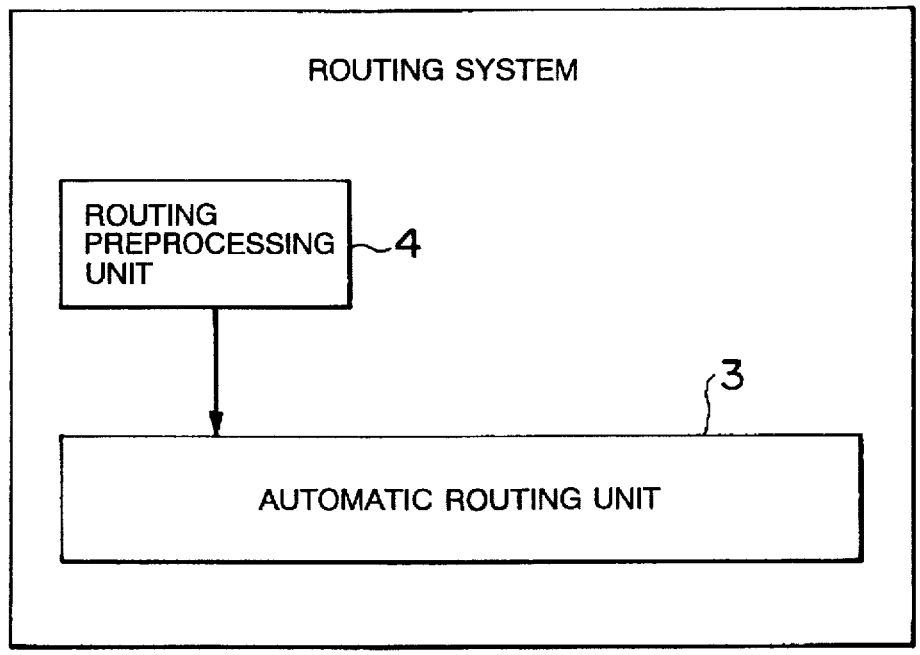
FIG. 24 is a block diagram showing the construction of a second embodiment of a routing system according to the present invention.

The routing system illustrated in FIG. 24 is substantially the same as the system of FIG. 1 except such a point that the feedback section 2 is not provided, and the routing preprocessing unit 4 does not output the data to the feedback section 2. To be specific, the routing system shown in FIG. 24 is constructed of the routing preprocessing unit 4 and the automatic routing unit 3.

Figure 25:
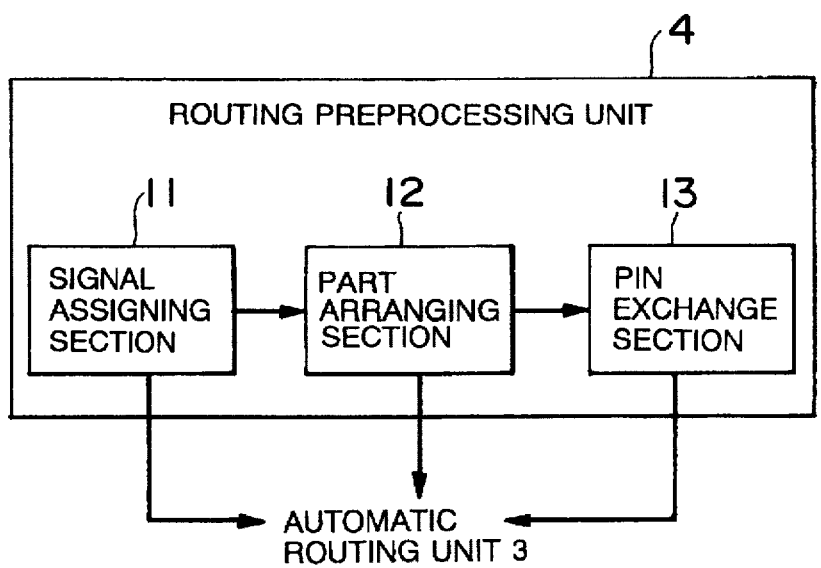
FIG. 25 is a block diagram showing a detailed configuration of a routing preprocessing unit of the routing system of FIG. 24.

The routing preprocessing unit 4 in this case includes, as illustrated in FIG. 25, the signal assigning section 11, the part arrangement section 12 and the pin exchange section 14.

The signal assigning section 11 and the part arrangement section 12 are absolutely the same as those of FIG. 2, and the pin exchange section 14 is the one wherein the function for outputting the pin exchange data for feedback from the pin exchange section 13 is omitted.

In the case of the system in the second embodiment, the operation thereof is also the same as that of the system in the first embodiment discussed above except such a point that the pin assignment of the high-order hierarchy part itself is not changed. Further, the system in the second embodiment is also capable of automatically effectively creating the wiring patterns even on the single layer PCB including not the multilayer PCB but only the single routing layer. In the case of the single layer PCB, there is eliminated the necessity for the whole routing layer allocating section of the automatic routing unit 3. When dedicated to the single layer PCB, the routing system may be configured by eliminating the routing layer allocating section 31 of the automatic routing unit 3. This is the same as the system in the first embodiment.

<Embodiment 3>

A routing system according to a third embodiment of the present invention will be described with reference to FIG. 26. Thus routing system is configured as a system for properly creating the wiring patterns on the multilayer PCB when incapable of performing the preprocessing to arrange the parts and to change the pin assignment of the parts.

Figure 26:
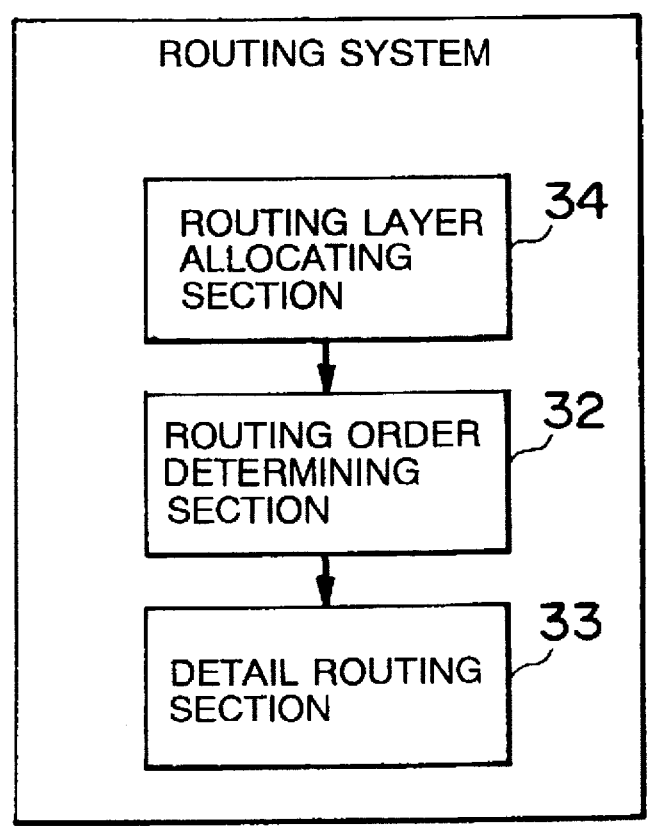
FIG. 26 is a block diagram showing the construction of a third embodiment of a routing system according to the present invention.

In the routing system illustrated in FIG. 26, the automatic routing unit 3 is constructed the same as the automatic routing unit 3 shown in FIG. 4 except such a point that a routing layer allocating section 34 undergoing no preprocessing is provided in place of the routing layer allocating section 31. That is, the routing system of FIG. 26 includes the routing layer allocating section 34, the routing order determining section 32 and the detail routing section 33. This routing system designs the high-density wiring patterns without using the via as much as possible on the basis of the original circuit data undergoing no preprocessing.

The routing layer allocating section 34 collects the part-to-part route bundles bearing such a positional relationship as to cause no intersection and no overlap on the basis of given items of routing data and allocates the route bundle to the same routing layer on the multilayer routing board including the plurality of routing layers. This routing layer allocating section 34 is capable of routing the route bundle allocated to the same routing layer invariably within the same routing layer because of no intersection and no overlap. The routing layer allocating section 34 also sets the virtual route bundles to be routed at the minimum distance for every part coupling in the units of a part. The routing layer allocating section 34 then groups such route bundles for every route bundle with no intersection and no overlap and further allocates the grouped route bundles to the respective routing layers.

The routing system in the third embodiment is different from the routing system in the first or second embodiment in terms of only the point that the given routing data are not preprocessed. Excepting this point, the operation is the same as that of the automatic routing unit 3 of the routing system in the above-discussed first or second embodiment.

It is apparent that, in this invention, a wide range of different working modes can be formed based on the invention without deviating from the spirit and scope of the invention. This invention is not restricted by its specific working modes except being limited by the appended claims.

What is claimed is:

1. A routing system for wiring parts, each part having a plurality of connection lines, of an original circuit together on a multilayer circuit board having a plurality of layers, the routing system comprising:

connection allocating means for setting an allocation of connection lines, for each part having a signal assignment that can be arbitrarily set, to minimize intersections by making directional vectors of each of the plurality of connection lines extending from a part to have approximately the same direction;

part arranging means for setting an arrangement of the parts to minimize intersections of synthetic vectors of the connection lines based on data output by said connection allocating means;

pin assigning means for changing an inter-part pin assignment of parts having a changeable inter-part pin assignment so as to avoid an intersection of the connection lines based on data output by said part arranging means;

layer allocating means for creating route bundles of parts having a positional relationship without intersections or overlaps based on data output by said pin assigning means and allocating the route bundle to the same routing layer on the multilayer circuit board;

order setting means for setting a routing order for each routing layer based on data output by said layer allocating means; and pattern creating means creating wiring patterns on the multilayer circuit board by setting routing positions within each routing layer in accordance with the routing order set by said order setting means.

2. A routing system according to claim 1, wherein said pin assigning means includes feedback means for feeding data for changing the pin assignment to a design system of high-order hierarchy parts.

3. A routing system according to claim 1, wherein said layer allocating means includes:

virtual routing means for arranging a virtual route bundle at a minimum distance between the parts;

grouping means for grouping the virtual route bundles arranged by said virtual routing means to form route bundles having no intersection and no overlap; and group allocating means for allocating the respective groups obtained by said grouping means to different routing layers.

4. A routing system according to claim 3, wherein said order setting means includes:

route bundle order setting means for setting a routing order of a route bundle from a route bundle positioned at the edge with respect to the virtual route bundles arranged by said virtual routing means;

diverting direction setting means for setting a diverting direction of the route bundle in accordance with the routing order set by said route bundle order setting means; and routing order setting means for setting the routing order within each route bundle in accordance with the diverting direction from a route at a far distance with respect to the routes within the route bundle.

5. A routing system according to claim 1, wherein said pattern creating means includes route setting means for setting a route using a parallelogram as a minimum part-to-part routing distance and extending a search line in a direction along this parallelogram.

6. A routing system for wiring parts, each part having a plurality of connection lines, of an original circuit together on a multilayer circuit board having a plurality of layers, the routing system comprising:

connection allocating means for setting an allocation of connection lines, for each part having a signal assignment that can be arbitrarily set, to minimize intersections by making directional vectors of the connection lines extending from a part to have approximately the same direction;

part arranging means for setting an arrangement of the parts to minimize intersections of synthetic vectors of the connection lines based on data output by said connection allocating means;

pin assigning means for changing an inter-part pin assignment of parts having a changeable inter-part pin assignment so as to avoid an intersection of the connection lines based on data output by said part arranging means;

order setting means for setting a routing order based on data output by said pin assigning means; and pattern creating means for creating wiring patterns on the multilayer circuit board by setting routing positions in accordance with the routing order set by said order setting means.

7. A routing system according to claim 6, wherein said pin assigning means includes feedback means for feeding data for changing the pin assignment to a design system of high-order hierarchy parts.

8. A routing system according to claim 6, wherein said order setting means includes:

virtual routing means for arranging a virtual route bundle at a minimum distance between the parts;

route bundle order setting means for setting a routing order of a route bundle from a route bundle positioned at the edge with respect to the virtual route bundles arranged by said virtual routing means;

diverting direction setting means for setting a diverting direction of the route bundle in accordance with the routing order set by said route bundle order setting means; and routing order setting means for setting the routing order within each route bundle in accordance with the diverting direction from a route at a far distance with respect to the routes within the route bundle.

9. A routing system according to claim 6, wherein said pattern creating means includes route setting means for setting a route using a parallelogram as a minimum part-to-part routing distance and extending a search line in a direction along this parallelogram.

10. A routing system for wiring parts, each part having a plurality of connection lines, of an original circuit together on a multilayer circuit board having a plurality of layers, the routing system comprising:

layer allocating means for creating route bundles of parts having a positional relationship without intersections and overlaps on the basis of the routing data and allocating the mute bundle to the same routing layer on the multilayer circuit board including a plurality of routing layers;

order setting means for setting a routing order for each routing layer based on data output by said layer allocating means; and pattern creating means for creating wiring patterns on the multilayer circuit board by setting routing positions within each routing layer in accordance with the routing order set by said order setting means.

11. A routing system according to claim 10, wherein said layer allocating means includes:

virtual routing means for arranging a virtual route bundle at a minimum distance between the parts;

grouping means for grouping the virtual route bundles arranged by said virtual routing means to form route bundles having no intersection and no overlap; and group allocating means for allocating the respective groups obtained by said grouping means to different routing layers.

12. A routing system according to claim 11, wherein said order setting means includes:

route bundle order setting means for setting a routing order of a route bundle from a route bundle positioned at the edge with respect to the virtual route bundles arranged by said virtual routing means;

diverting direction setting means for setting a diverting direction of the route bundle in accordance with the routing order set by said route bundle order setting means; and routing order setting means for setting the routing order within each route bundle in accordance with the diverting direction from a route at a far distance with respect to the routes within the route bundle.

13. A routing system according to claim 10, wherein said pattern creating means includes route setting means for setting a route using a parallelogram as a minimum part-to-part routing distance and extending a search line in a direction along this parallelogram.

14. A routing method for wiring parts, each part having a plurality of connection lines, of an original circuit together on a multilayer circuit board having a plurality of layers, the routing method comprising:

a connection allocating step of setting an allocation of connection lines for each part having a signal assignment that can be arbitrarily set to minimize intersections by making directional vectors of each of the plurality of connection lines extending from a part to have approximately the same direction;

a part arranging step of setting an arrangement of the parts to minimize intersections of synthetic vectors of the connection lines based on data output in said connection allocating step;

a pin assigning step of changing an inter-part pin assignment of parts having a changeable inter-part pin assignment so as to avoid an intersection of the connection lines based on data output in said part arranging step;

a layer allocating step of creating route bundles of parts having a positional relationship without intersections or overlaps based on data output by said pin assigning step and allocating the route bundle to the same routing layer on the multilayer circuit board;

an order setting step of setting a routing order for each routing layer on the basis of the routing data undergoing the routing layer allocation processing in said layer allocating step; and a pattern creating step of creating wiring patterns on the circuit board by setting routing positions within each routing layer in accordance with the routing order set in said order setting step.

15. A routing method according to claim 14, wherein said pin assigning step includes a feedback step of feeding data for changing the pin assignment to a design system of high-order hierarchy parts.

16. A routing method according to claim 14, wherein said layer allocating step includes:

a virtual routing step of arranging a virtual route bundle at a minimum distance between the parts;

a grouping step of grouping the virtual route bundles arranged in said virtual routing step to form route bundles having no intersection and no overlap; and a group allocating step of allocating the respective groups obtained in said grouping step to different routing layers.

17. A routing method according to claim 16, wherein said order setting step includes:

a route bundle order setting step of setting a routing order of a route bundle from a route bundle positioned at the edge with respect to the virtual route bundles arranged in said virtual routing step;

a diverting direction setting step of setting a diverting direction of the route bundle in accordance with the routing order set in said route bundle order setting step; and a routing order setting step of setting the routing order within each route bundle in accordance with the diverting direction from a route at a far distance with respect to the routes within the route bundle.

18. A routing method according to claim 14, wherein said pattern creating step includes a route setting step of setting a route using a parallelogram as a minimum part-to-part routing distance and extending a search line in a direction along this parallelogram.

19. A routing method for wiring parts, each part having a plurality of connection lines, of an original circuit together on a multilayer circuit board having a plurality of layers, the routing method comprising:

a connection allocating step of setting an allocation of connection lines for each part having a signal assignment that can be arbitrarily set to minimize intersections by making directional vectors of the connection lines extending from a part to have approximately the same direction;

a part arranging step of setting an arrangement of the parts to minimize intersections of synthetic vectors of the connection lines based on data output in said connection allocating step;

a pin assigning step of changing an inter-part pin assignment of parts having a changeable inter-part pin assignment so as to avoid an intersection of the connection lines based on data output in said part arranging step;

a order setting step of setting a routing order based on data output in said pin assigning step; and a pattern creating step of creating wiring patterns on the multilayer circuit board by setting routing positions in accordance with the routing order set in said order setting step.

20. A routing method according to claim 19, wherein said pin assigning step includes a feedback step of feeding data for changing the pin assignment to a design system of high-order hierarchy parts.

21. A routing method according to claim 19, wherein said order setting step includes:

a virtual routing step of arranging a virtual route bundle at a minimum distance between the parts;

a route bundle order setting step of setting a routing order of a route bundle from a route bundle positioned at the edge with respect to the virtual route bundles arranged in said virtual routing step;

a diverting direction setting step of setting a diverting direction of the route bundle in accordance with the routing order set in said route bundle order setting step; and a routing order setting step of setting the routing order within each route bundle in accordance with the diverting direction from a route at a far distance with respect to the routes within the route bundle.

22. A routing method according to claim 19, wherein said pattern creating step includes a route setting step of setting a route using a parallelogram as a minimum part-to-part routing distance and extending a search line in a direction along this parallelogram.

23. A routing method for wiring parts, each part having a plurality of connection lines, of an original circuit together on a multilayer circuit board having a plurality of layers, the routing method comprising:

a layer allocating step of creating route bundles of parts having a positional relationship without intersections and overlaps on the basis of the routing data and allocating the route bundle to the same routing layer on the multilayer circuit board including a plurality of routing layers;

an order setting step of setting a routing order for each routing layer based on data output in said layer allocating step; and a pattern creating step of creating wiring patterns on the multilayer circuit board by setting routing positions within each routing layer in accordance with the routing order set in said order setting step.

24. A routing method according to claim 23, wherein said layer allocating step includes:

a virtual routing step of arranging a virtual route bundle at a minimum distance between the parts;

a grouping step of grouping the virtual route bundles arranged in said virtual routing step to form route bundles having no intersection and no overlap; and a group allocating step of allocating the respective groups obtained in said grouping step to different routing layers.

25. A routing method according to claim 24, wherein said order setting step includes:

a route bundle order setting step of setting a routing order of a route bundle from a route bundle positioned at the edge with respect to the virtual route bundles arranged in said virtual routing step;

a diverting direction setting step of setting a diverting direction of the route bundle in accordance with the routing order set in said route bundle order setting step; and a routing order setting step of setting the routing order within each route bundle in accordance with the diverting direction from a route at a far distance with respect to the routes within the route bundle.

26. A routing method according to claim 23, wherein said pattern creating step includes a route setting step of setting a route using a parallelogram as a minimum part-to-part routing distance and extending a search line in a direction along this parallelogram.

* * * * *

UNITED STATES PATENT AND TRADEMARK OFFICE
CERTIFICATE OF CORRECTION

PATENT NO. : 5,729,467
DATED : March 17, 1998
INVENTOR(S) : Katsumata et al.

It is certified that error appears in the above-identified patent and that said Letters Patent is hereby corrected as shown below:

Col. 1,   line 9, change " "PBC" " to --"PCB"--.
Col. 6,   line 23, "FIG. 1" does not begin a new paragraph;
          line 26, "FIG. 2" does not begin a new paragraph;
Col. 8,   line 23, change "units-of" to --units of--;
          line 35, "FIG. 8" does not begin a new paragraph;
          line 53, "FIG. 10" does not begin a new paragraph.
Col. 14,  line 17, change "mute" to --route--.

Signed and Sealed this

Sixteenth Day of June, 1998

Attest:

BRUCE LEHMAN

*Attesting Officer*       *Commissioner of Patents and Trademarks*